(12) United States Patent
Kim

(10) Patent No.: US 7,554,413 B2
(45) Date of Patent: Jun. 30, 2009

(54) VOLTAGE CONTROLLED OSCILLATOR WITH COMPENSATION FOR POWER SUPPLY VARIATION IN PHASE-LOCKED LOOP

(75) Inventor: Young-Sik Kim, Gwacheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 87 days.

(21) Appl. No.: 11/811,552

(22) Filed: Jun. 11, 2007

(65) Prior Publication Data

US 2008/0007367 A1 Jan. 10, 2008

(30) Foreign Application Priority Data

Jun. 23, 2006 (KR) .................. 10-2006-0056802

(51) Int. Cl.
*H03L 7/26* (2006.01)
(52) U.S. Cl. .................. 331/16; 331/17; 331/177 R; 331/57
(58) Field of Classification Search .................. 331/57, 331/8, 16–18, 177 R, 186
See application file for complete search history.

(56) References Cited

U.S. PATENT DOCUMENTS

| | | | | |
|---|---|---|---|---|
| 5,428,310 | A | * | 6/1995 | Casper et al. .................. 327/262 |
| 5,708,396 | A | * | 1/1998 | Mizuno .................. 331/57 |
| 6,781,425 | B2 | * | 8/2004 | Si .................. 327/148 |

OTHER PUBLICATIONS

Japanese Patent Application No. 05-162938 to Hidekazu, having Publication data of Mar. 17, 1995 (w/ English Abstract page).
Japanese Patent Application No. 05-322755 to Susumu, having Publication date of Jul. 14, 1995 (w/ English Abstract page).
Japanese Patent Application No. 06-055706 to Masanobu, having Publication date of Oct. 13, 1995 (w/ English Abstract page).

* cited by examiner

*Primary Examiner*—Anh Q Tran
(74) *Attorney, Agent, or Firm*—Monica H. Choi

(57) ABSTRACT

A voltage-controlled oscillator (VCO) according to an aspect of the present invention includes an oscillation unit and a delay time control unit. The oscillation unit generates an oscillation signal with a frequency determined by a VCO control signal. The delay time control unit adjusts a delay of the oscillation signal in response to a change of a power supply voltage. Such a VCO is advantageously used for minimizing signal skew in a phase-locked loop (PLL).

19 Claims, 8 Drawing Sheets

VOLTAGE CONTROLLED OSCILLATOR WITH COMPENSATION FOR POWER SUPPLY VARIATION IN PHASE-LOCKED LOOP

BACKGROUND OF THE INVENTION

This application claims priority under 35 USC § 119 to Korean Patent Application No. 2006-56802, filed on Jun. 23, 2006 in the Korean Intellectual Property Office, the disclosure of which is incorporated herein in its entirety by reference.

FIELD OF THE INVENTION

The present invention relates generally to voltage controlled oscillators, and more particularly, to compensating for power supply variation to minimize skew at the output of a voltage controlled oscillator in a phase-locked loop.

BACKGROUND OF THE INVENTION

A phase-locked loop (PLL) is widely used in communication systems, multimedia systems, and other applications. A frequency synthesizer, an FM demodulator, a clock recovery circuit, a modem, and a tone decoder are examples of devices that use a PLL.

Typically, a PLL includes a phase-frequency detector (PFD), a charge pump, a loop filter, and a voltage-controlled oscillator (VCO). The PLL generates an up signal and/or a down signal, generates a control voltage for a VCO, and adjusts a frequency of a feedback signal based on a phase difference (and a frequency difference) between an input signal and the feedback signal.

When a PLL is in lock mode, the phase difference (and the frequency difference) between the input signal and the feedback signal is locked. When a PLL is not in lock mode, the phase difference (and the frequency difference) between a reference signal and the feedback signal is unlocked. In lock mode in the prior art, the amount of electric charge charging a capacitor of a loop filter is desired to be substantially same as the amount of electric charge discharging the capacitor of the loop filter such that the control voltage for the VCO remains constant.

In the prior art, when the magnitude of a power supply voltage is changed, the magnitude of the control voltage for the VCO is not changed and may remain constant. In that case, the magnitude of a charging current and the magnitude of a discharging current generated from the charge pump of the PLL differ from each other. Such different charging and discharging currents may cause skew to be generated between the input signal and the feedback signal in the lock mode.

SUMMARY OF THE INVENTION

Accordingly, the present invention adjusts a control signal to the VCO of the PLL with change of the power supply voltage for minimizing signal skew in the PLL.

A voltage-controlled oscillator (VCO) according to an aspect of the present invention includes an oscillation unit and a delay time control unit. The oscillation unit generates an oscillation signal with a frequency determined by a VCO control signal. The delay time control unit adjusts a delay of the oscillation signal in response to a change of a power supply voltage.

In an embodiment of the present invention, the delay time control unit adjusts the delay of the oscillation signal by adjusting at least one capacitance between the oscillation unit and a reference node in response to the change of the power supply voltage. For example, the delay time control unit increases the delay of the oscillation signal in response to an increase in the power supply voltage and decreases the delay of the oscillation signal in response to a decrease in the power supply voltage.

The delay time control unit according to an example embodiment of the present invention includes a voltage divider, a plurality of capacitors and a plurality of field effect transistors. The voltage divider is coupled between a power supply generating the power supply voltage and the reference node, and the voltage divider generates a switch control voltage. A respective one of the transistors and a respective one of the capacitors are coupled in series between the oscillation unit and the reference node, and the switch control voltage is applied at gates of the transistors.

In another embodiment of the present invention, the delay time control unit further includes a frequency compensation capacitor coupled between the gates of the transistors and the reference node.

In a further embodiment of the present invention, the oscillation unit includes a plurality of inverters coupled as a ring oscillator, and the inverters are pulled-up by the VCO control signal. In that case, a respective one of the transistors and a respective one of the capacitors are coupled in series between an output of a respective one of the inverters and the reference node.

In another embodiment of the present invention, the VCO is coupled in a feed-back loop of a phase-locked loop (PLL), and the VCO control signal is adjusted with the adjusted delay of the oscillation signal. For example, the VCO control signal increases in response to an increase in the power supply voltage, and the VCO control signal decreases in response to a decrease in the power supply voltage.

Such a PLL for example includes a phase-frequency detector, a charge pump, a loop filter, and the above recited example embodiments of the VCO. The phase-frequency detector generates up and down signals from a phase difference between an input signal and the oscillation signal. The charge pump generates charging and discharging currents in response to the up and down signals. The loop filter generates the VCO control signal by integrating the charging and discharging currents.

In an example embodiment of the present invention, the charge pump includes first and second current sources, first and second PMOS transistors, first and second NMOS transistors, and an operational amplifier. The first current source has a first terminal coupled to a power supply generating the power supply voltage. The first PMOS transistor has a source coupled to a second terminal of the first current source, a gate having the up signal applied thereon, and a drain coupled to a first node. The second PMOS transistor has a source coupled to the second terminal of the first current source, a gate having an inverse of the up signal applied thereon, and a drain coupled to a second node. The operational amplifier is configured as a voltage-follower between the first and second nodes.

In addition, the second current source has a first terminal coupled to a reference node. The first NMOS transistor has a drain coupled to the first node, a gate having an inverse of the down signal applied thereon, and a source coupled to a second terminal of the second current source. The second NMOS transistor has a drain coupled to the second node, a gate having the down signal applied thereon, and a source coupled to the second terminal of the second current source.

In an example embodiment of the present invention, the charging and discharging currents have substantially same magnitudes when a following condition is satisfied, VCON= (VDD+|Vtp|−Vtn)/2, with VCON being the VCO control voltage, VDD being the power supply voltage, Vtn being a threshold voltage of the second NMOS transistor, and Vtp being a threshold voltage of the second PMOS transistor. In that case, the VCO control signal increases in response to an increase in the power supply voltage, and the VCO control signal decreases in response to a decrease in the power supply voltage.

In another embodiment of the present invention, the PLL further includes a frequency divider coupled between the VCO and the phase-frequency detector for performing frequency division on the oscillation signal. In that case, the phase-frequency detector generates the up and down signals from a phase difference between the input signal and the frequency-divided oscillation signal.

In this manner, the VCO control signal is changed according to the change of the power supply voltage such that the charging and discharging currents have substantially same magnitudes. Thus, skew of signals of the PLL is minimized even with the change of the power supply voltage.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, and 9 refer to elements having similar structure and/or function.

DETAILED DESCRIPTION OF THE INVENTION

Figure 1:
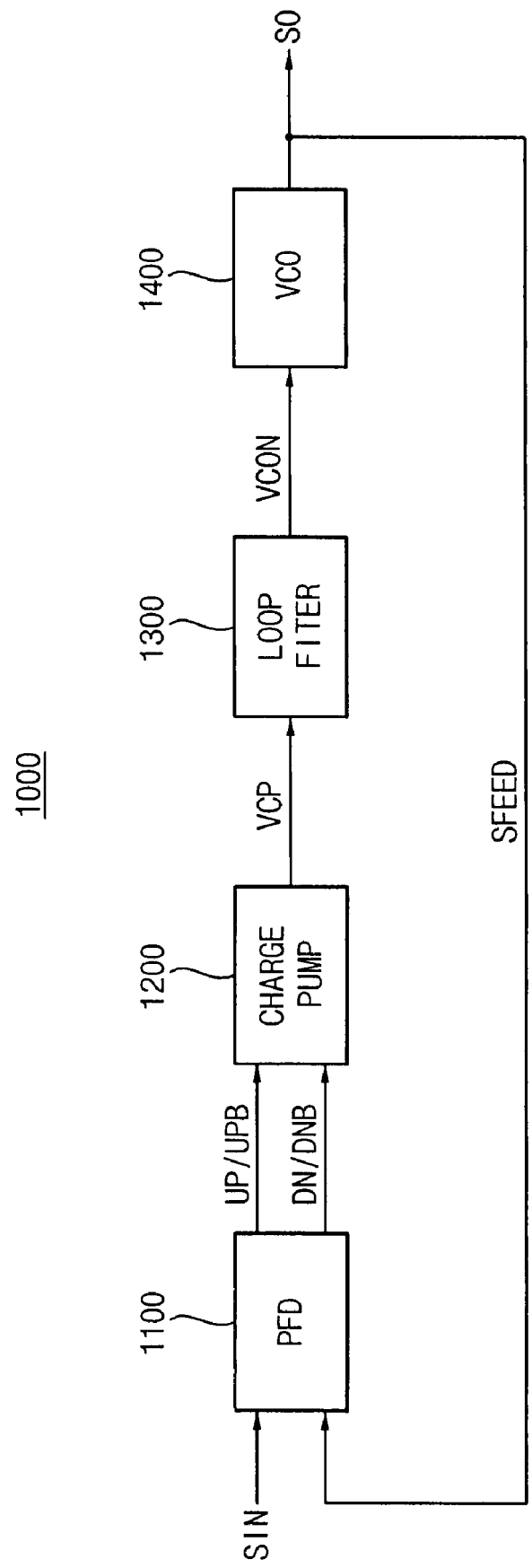
FIG. 1 is a block diagram of a phase-locked loop (PLL), according to an example embodiment of the present invention.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a phase-locked loop (PLL) 1000 according to an example embodiment of the present invention. Referring to FIG. 1, the PLL 1000 includes a phase-frequency detector (PFD) 1100, a charge pump 1200, a loop filter 1300, and a voltage-controlled oscillator (VCO) 1400.

The PFD 1100 generates an up signal UP, an up bar signal UPB, a down signal DN, and a down bar signal DNB based on a phase difference (and a frequency difference) between an input signal SIN and a feedback signal SFEED. The up bar signal UPB is an inverse of the up signal UP, and the down bar signal DNB is an inverse of the down signal DN.

The charge pump 1200 generates a charging current and a discharging current in response to the up signal UP and/or the down signal DN. The loop filter 1300 integrates the charging current and the discharging current from the charge pump 1200 and produces a VCO control signal VCON which is a VCO control voltage VCON in an embodiment of the present invention.

An input terminal and an output terminal of the loop filter 1300 are electrically connected to each other in one embodiment of the present invention. Therefore, an input voltage VCP of the loop filter 1300 is substantially the same voltage as the VCO control voltage VCON.

The VCO 1400 generates an oscillation signal SO having a frequency dependent on a magnitude of the VCO control voltage VCON. As described in more detail below, the VCO 1400 includes an oscillation unit and a delay time control unit. The feedback signal SFEED is the oscillation signal SO that is fed back from the VCO 1400 to the PFD 1100.

When the PLL is in lock mode, the phase difference (and the frequency difference) between the input signal SIN and the feedback signal SFEED is locked. In lock mode, the oscillation signal SO is used as an internal clock signal. When the PLL is not in lock mode, the phase difference (and the frequency difference) between the input signal SIN and the feedback signal SFEED is unlocked.

Figure 2:
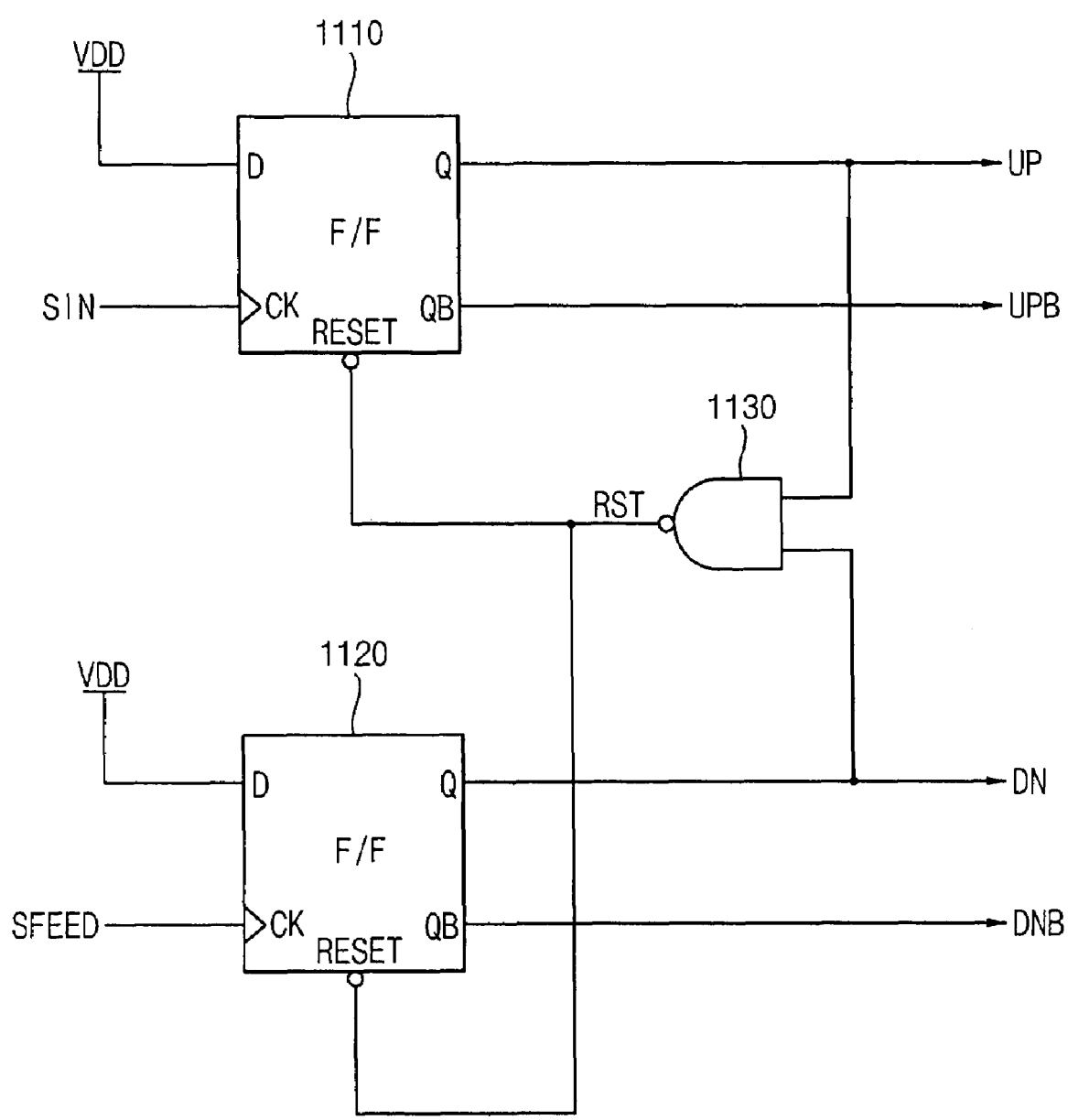
FIG. 2 is a circuit diagram of a phase-frequency detector (PFD) in the PLL of FIG. 1, according to an example embodiment of the present invention.

FIG. 2 is a circuit diagram of the PFD 100 in the PLL of FIG. 1, according to an example embodiment of the present invention. Referring to FIG. 2, the PFD 1100 includes a first D-type flip-flop 1110, a second D-type flip-flop 1120, and a NAND gate 1130.

The first D-type flip-flop 1110 has a first input terminal D to which a logic "high" voltage that is a power supply voltage VDD is applied, a first clock terminal CK to which the input signal SIN is applied, and a first reset terminal RESET to which a reset signal RST from the NAND gate 1130 is applied. The first D-type flip-flop 1110 also has a first output terminal Q from which the up signal UP is outputted, and has a second output terminal QB from which the up bar signal UPB is outputted.

The second D-type flip-flop 1120 has a second input terminal D to which the logic "high" voltage is applied, a second clock terminal CK to which the feedback signal SFEED is applied, and a second reset terminal RESET to which the reset signal RST is applied. The second D-type flip-flop 1120 also has a third output terminal Q from which the down signal DOWN is outputted, and has a fourth output terminal QB from which the down bar signal DNB is outputted.

The reset terminals of the first D-type flip-flop 1110 and the second D-type flip-flop 1120 operate in active "low". The NAND gate 1130 performs a NAND operation on the up signal UP and the down signal DN to generate the reset signal RST.

Figure 3:
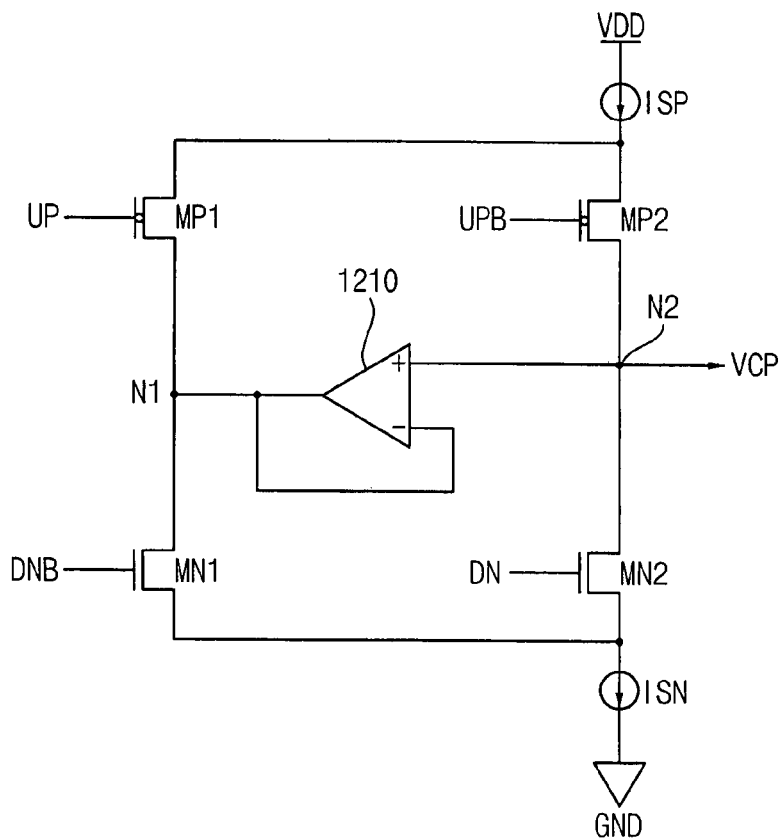
FIG. 3 is a circuit diagram of a charge pump in the PLL of FIG. 1, according to an example embodiment of the present invention.

FIG. 3 is a circuit diagram of the charge pump 1200 in the PLL of FIG. 1, according to an embodiment of the present invention. Referring to FIG. 3, the charge pump 1200 includes a first current source ISP, a first PMOS transistor MP1, a second PMOS transistor MP2, an operational amplifier 1210, a second current source ISN, a first NMOS transistor MN1, and a second NMOS transistor MN2.

The first current source ISP has a first terminal coupled to the power supply voltage VDD. The first PMOS transistor MP1 has a source coupled to a second terminal of the first current source ISP, a gate having the up signal UP applied thereon, and a drain coupled to a first node N1. The second PMOS transistor MP2 has a source coupled to the second terminal of the first current source ISP, a gate having the up bar signal UPB applied thereon, and a drain coupled to a second node N2.

The operational amplifier 1210 is configured as a voltage follower between the first and second nodes N1 and N2. Thus, the operational amplifier 1210 has a non-inverting input terminal coupled to the second node N2, an output terminal coupled to the first node N1, and an inverting input terminal coupled to the output terminal.

The second current source ISN has a first terminal coupled to a reference node which has a ground voltage GND thereon. The first NMOS transistor MN1 has a drain coupled to the first node N1, a gate having the down bar signal DNB applied thereon, and a source coupled to a second terminal of the second current source ISN. The second NMOS transistor MN2 has a drain coupled to the second node N2, a gate having the down signal DN applied thereon, and a source coupled to the second terminal of the second current source ISN.

Figure 4:
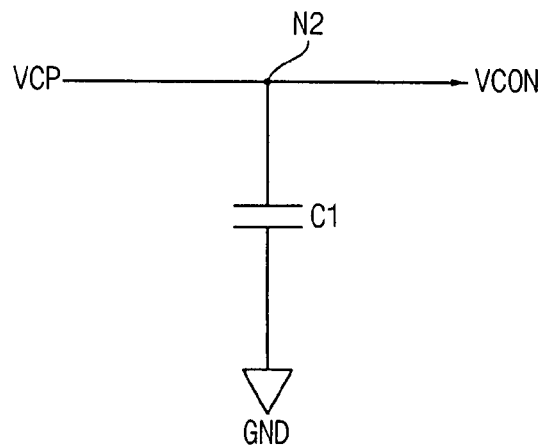
FIG. 4 is a circuit diagram of an example loop filter in the PLL of FIG. 1, according to an example embodiment of the present invention.

FIG. 4 is a circuit diagram of the loop filter 1300 in the PLL of FIG. 1, in one embodiment of the present invention. Referring to FIG. 4, the loop filter 1300 includes a capacitor C1. However, the present invention may also be practiced with the loop filter 1300 also including a resistor.

Hereinafter, operation of the charge pump 1200 and the loop filter 1300 of FIGS. 3 and 4 are now described. With the operational amplifier 1210 configured as a voltage follower, a voltage at the first node N1 is substantially the same as a voltage of the second node N2. In that case, a drain-to-source voltage of the first PMOS transistor MP1 is substantially same as a drain-to-source voltage of the second PMOS transistor MP2. Also in that case, a drain-to-source voltage of the first NMOS transistor MN1 is substantially same as a drain-to-source voltage of the second NMOS transistor MN2.

Generally, if a drain-to-source voltage of a MOS transistor changes, a drain current of such a MOS transistor changes even as the same gate voltage is applied. Thus, the first and second PMOS transistors MP1 and MP2 each conduct a same magnitude of current when turned on with a same gate voltage. Similarly, the first and second NMOS transistors MN1 and MN2 each conduct a same magnitude of current when turned on with a same gate voltage.

Operation is now described for the charge pump 1200 when the up signal UP is set to a logic "high" state and the down signal DN is set to a logic "low" state. In that case, the up bar signal UPB is set to a logic "low" state, and the down bar signal DNB is set to a logic "high" state. Consequently, the second PMOS transistor MP2 is turned on, and the second NMOS transistor MN2 is turned off, such that a charging current flows from the second PMOS transistor MP2 to charge the capacitor C1 of the loop filter 1300.

Since the up signal UP and the down bar signal DNB are both set to a logic "high" state, the first PMOS transistor MP1 is turned off, and the first NMOS transistor MN1 is turned on. With the first NMOS transistor MN1 being turned on, the voltage of a source of the second NMOS transistor MN2 is substantially same as the voltage of the second node N2 which is the input voltage VCP of the loop filter 1300.

Operation is now described for the charge pump 1200 when the up signal UP is set to a logic "low" state and the down signal DN is set to a logic "high" state. In that case, the up bar signal UPB is set to a logic "high" state, and the down bar signal DNB is set to a logic "low" state. Consequently, the second PMOS transistor MP2 is turned off, and the second NMOS transistor MN2 is turned on such that a discharging current is generated from the second NMOS transistor MN2 to discharge the capacitor C1 of the loop filter 1300.

Since the up signal UP and the down bar signal DNB are both set to a logic "low" state, the first PMOS transistor MP1 is turned on, and the first NMOS transistor MN1 is turned off. With the first PMOS transistor MP1 being turned on, the voltage at a source of the second PMOS transistor MP2 is substantially same as the voltage at the second node N2 which is the input voltage VCP of the loop filter 1300.

When the PLL 1000 is phase-locked, the charging current generated from the second PMOS transistor MP2 is desired to be substantially same as the discharging current generated from the second NMOS transistor MN2. However, because characteristics of PMOS and NMOS transistors are different, time points when the PMOS and NMOS transistors MP2 and MN2 are turned on/off may differ. In that case, a charging time for charging the loop filter 1300 may be different from a discharging time for discharging the loop filter 1300.

The time points when the second NMOS transistor MN2 and the second PMOS transistor MP2 are turned on/off are substantially same when the following Equation 1 is satisfied:

$$VGSn-Vtn=|VGSp-Vtp| \quad\quad \text{[Equation 1]}$$

Above, VGSn is a gate-to-source voltage of the second NMOS transistor MN2, Vtn is a threshold voltage of the second NMOS transistor MN2, VGSp is a gate-to-source voltage of the second PMOS transistor MP2, and Vtp is a threshold voltage of the second PMOS transistor MP2.

In the example of FIG. 3, a logic "high" state for the up signal UP, the up bar signal UPB, the down signal DN, and the down bar signal DNB means being set to the power supply voltage VDD. A logic "low" state for the up signal UP, the up bar signal UPB, the down signal DN, and the down bar signal DNB means being set to a reference voltage such a ground voltage (0V) of a ground node for example. Referring to FIG. 4, the output voltage VCP of the charge pump 1200 which is the voltage at the node N2 is the same as the VCO control voltage VCON.

In Equation 1, assume that a gate voltage to turn on the PMOS transistor MP2 (i.e., the up bar signal UPB) is zero, and that a gate voltage to turn on the NMOS transistor MN2 (i.e., the down signal DN) is VDD. In that case, VGSn=VDD−VCON, and VGSp=|0−VCON| such that Equation 1 may be re-expressed by the following Equation 2:

$$VCON=(VDD+|Vtp|+Vtn)/2 \quad\quad \text{[Equation 2]}$$

Thus, Equation 2 indicates that when the PLL circuit is in lock mode, the magnitude of the VCO control voltage VCON should be changed according to any change of the power supply voltage VDD for maintaining the time points when the second NMOS transistor MN2 and the second PMOS transistor MP2 are turned on/off to be substantially same.

However, in a conventional PLL, the VCO control voltage is not adjusted with a change to the power supply voltage. Therefore, a mismatch undesirably results between the magnitudes of the changing current and the discharging current of a charge pump in the conventional PLL resulting in signal skew.

Figure 5:
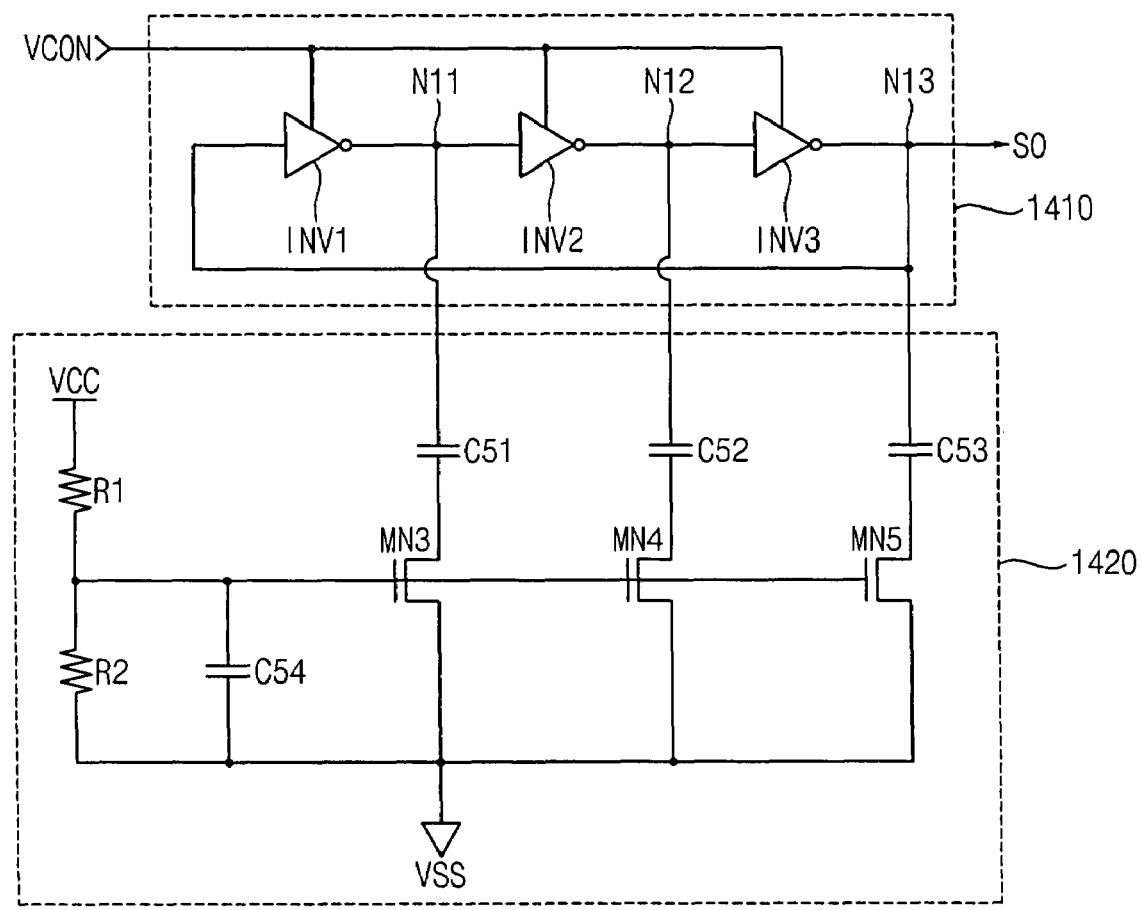
FIG. 5 is a circuit diagram of a voltage-controlled oscillator (VCO) in the PLL of FIG. 1, according to an example embodiment of the present invention.

FIG. 5 is a circuit diagram of the VCO 1400 in the PLL of FIG. 1, according to an example embodiment of the present invention. Referring to FIG. 5, the VCO 1400 includes an oscillation unit 1410 and a delay time control unit 1420.

The oscillation unit 1410 generates an oscillation signal SO having a frequency dependent on the VCO control voltage VCON. The delay time control unit 1420 adjusts a delay time of the oscillation signal SO in response to a change of the power supply voltage VDD.

Figure 6:
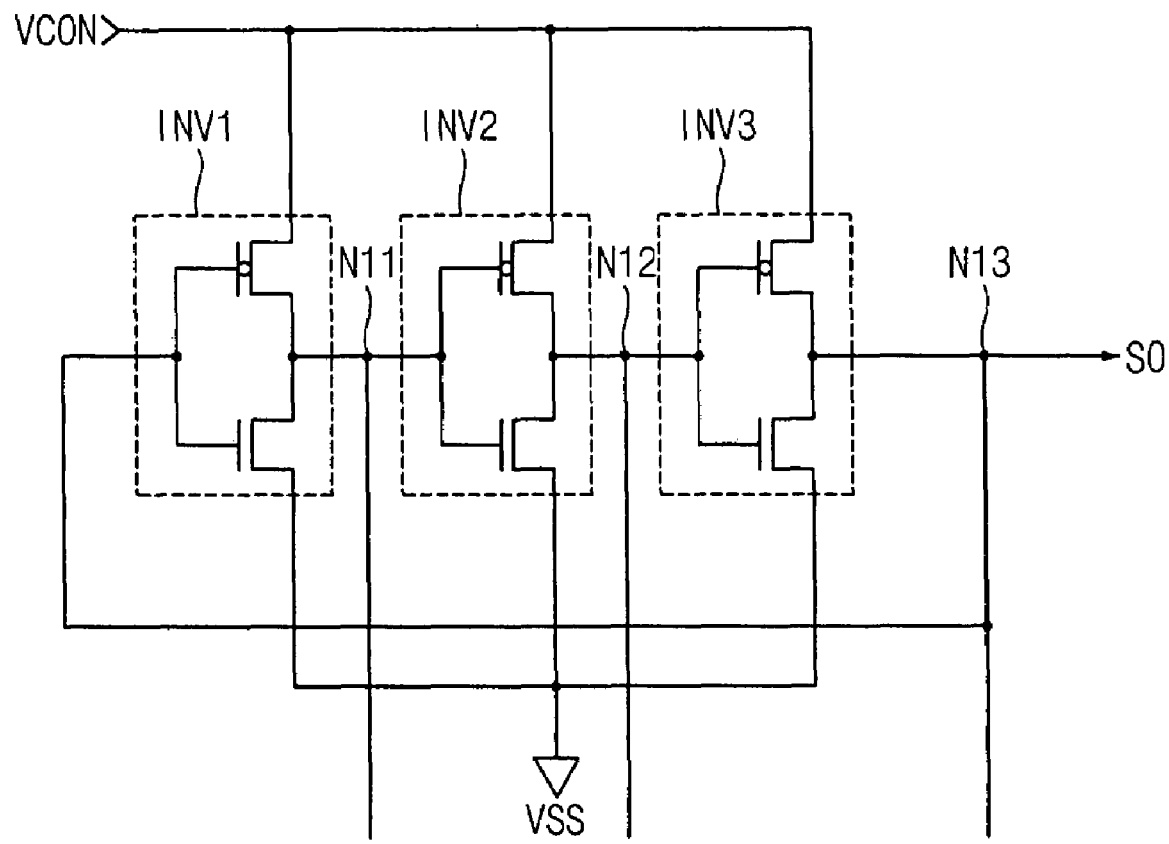
FIG. 6 is a more detailed circuit diagram of an oscillation circuit in the VCO of FIG. 5, according to an example embodiment of the present invention.

The oscillation unit 1410 includes a plurality of an odd number of inverters configured as a ring oscillator (i.e., a first inverter INV1, a second inverter INV2, and a third inverter INV3 in FIG. 5). Such inverters INV1, INV2, and INV3 are pulled up by the VCO control voltage VCON as illustrated in FIG. 6. In addition, such inverters INV1, INV2, and INV3 are connected to each other in a chain to form an electric loop.

Thus, an output terminal of the first inverter INV1 is coupled to an input terminal of the second inverter INV2. An output terminal of the second inverter INV2 is coupled to an input terminal of the third inverter INV3. An output terminal of the third inverter INV3 is coupled to an input terminal of the first inverter INV1.

The delay time control unit 1420 includes a first resistor R1, a second resistor R2, a first capacitor C51, a second capacitor C52, a third capacitor C53, a fourth capacitor C54, a third NMOS transistor MN3, a fourth NMOS transistor MN4, and a fifth NMOS transistor MN5. The first resistor R1 and the second resistor R2 are configures as a voltage divider.

Thus, a first terminal of the first resistor R1 is coupled to a power supply generating a power supply voltage VCC (which is same the as the power supply voltage VDD in FIG. 3), and the second resistor R2 is coupled between a second terminal of the first resistor R1 and a reference node VSS generating a reference voltage such as the ground node GND of FIG. 3 for example. The fourth capacitor C54 is coupled between the second terminal of the first resistor R1 and the ground node VSS.

The voltage divider formed with the resistors R1 and R2 generates a switch control voltage at the second terminal of the first resistor R1 by voltage division of the power supply voltage VCC. Such a switch control voltage is applied at gates of the NMOS transistors MN3, MN4, and MN5 also having sources coupled to the ground node VSS.

A respective one of the capacitors C51, C52, and C53 and a respective one of the NMOS transistors MN3, MN4, and MN5 are coupled in series between an output of a respective one of the inverters INV1, INV2, and INV3 and the reference node VSS. Thus, the first capacitor C51 is coupled between the output terminal of the first inverter INV1 and a drain of the third NMOS transistor MN3. The second capacitor C52 is coupled between the output terminal of the second inverter INV2 and a drain of the fourth NMOS transistor MN4. The third capacitor C53 is coupled between the output terminal of the third inverter INV3 and a drain of the fifth NMOS transistor MN5.

FIG. 6 shows a more detailed circuit diagram of the oscillation unit 1410 in the VCO 1400 of FIG. 5. Referring to FIGS. 5 and 6, each of the inverters INV1, INV2, and INV3 is implemented with a respective PMOS transistor and a respective NMOS transistor configured as a respective inverter. The VCO control voltage VCON pulls up the inverters INV1, INV2, and INV3 by being applied on sources of the PMOS transistors of the inverters INV1, INV2, and INV3.

Operation of the VCO 1400 of FIG. 5 is now described with reference to FIGS. 5 and 6. The delay time control unit 1420 adjusts a delay time of the oscillation signal SO by adjusting capacitances coupled between the oscillation unit 1410 and the ground node VSS in response to a change of the power supply voltage VCC.

For example, if the power supply voltage VCC increases, the switch control voltage applied at the gates of the NMOS transistors MN3, MN4, and MN5 increases. In that case, the capacitances between nodes N11, N12, and N13 in the oscillation unit 1410 and the ground node VSS increase. Accordingly, the delay time of the oscillation signal SO increases.

If the delay time of the oscillation signal SO increases, the frequency of the oscillation signal SO (and thus the feed back signal SFEED) decreases such that the up signal UP is activated to the logic "high" state. In that case, the charging current flows from the PMOS transistor MP2 of the charge pump 1200 such that the loop filter 1300 is charged. Accordingly, the VCO control voltage VCON increases such that the delay time of the oscillation signal SO decreases.

Conversely, if the power supply voltage VCC decreases, the switch control voltage applied at the gates of the NMOS transistors MN3, MN4, and MN5 decreases. In that case, the capacitances between the nodes N11, N12, and N13 in the oscillation unit 1410 and the ground node VSS decrease. Accordingly, the delay time of the oscillation signal SO decreases.

If the delay time of the oscillation signal SO decreases, the frequency of the oscillation signal SO (and thus the feed back signal SFEED) increases such that the down signal DN is activated to the logic "high" state. In that case, the discharging current flows from the NMOS transistor MN2 through the charge pump 1200 such that the loop filter 1300 is discharged. Accordingly, the VCO control voltage VCON decreases such that the delay time of the oscillation signal SO increases.

With such feedback, when locking is achieved several times for the PLL 1000, the PLL 1000 has no skew between the input signal SIN and the feedback signal SFEED such that exact locking is achieved. Another words, the VCO control voltage VCON is adjusted with any change to the power supply voltage VDD such that Equation 1 above is satisfied. In that case, the magnitudes of the charging current and the discharging current from the charge pump 1200 are maintained to have substantially same magnitudes in the lock mode for minimizing signal skew in the PLL 1000.

Figure 7:
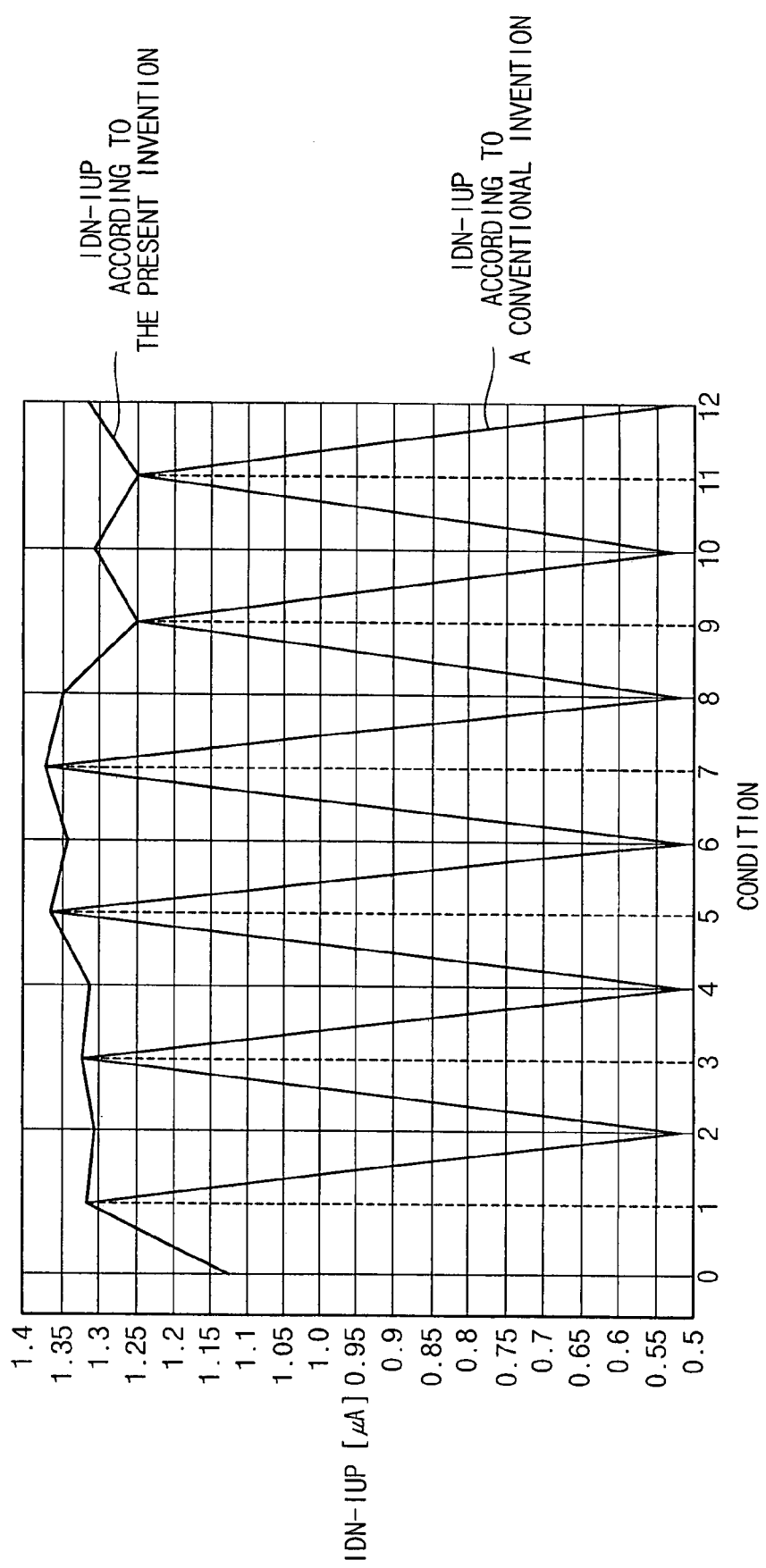
FIG. 7 is a waveform diagram of current through a loop filter in a conventional PLL versus in the PLL of FIG. 1.

FIG. 7 illustrates a waveform of current flowing through a loop filter of a conventional PLL and a waveform of current flowing through the loop filter 1300 of the PLL of FIG. 1. In FIG. 7, the horizontal axis represents operating conditions of the PLLs, and the vertical axis represents a difference between a discharging current IDN and a charging current IUP. Operating conditions includes fabrication processing conditions, a power supply voltage, and a temperature.

In the horizontal axis, 0 represents typical operating conditions such as a typical fabrication process, a power supply voltage of 1.8V, and a temperature of 55 degrees Celsius with an initial value of the VCO control voltage VCON being 0.9V. Also in the horizontal axis, 1, 3, 5, 7, 9, and 11 represent conditions where the power supply voltage of 1.8V is used and where the fabrication process and the temperature are changed. Further in the horizontal axis, 2, 4, 6, 8, 10, and 12 represent conditions where the power supply voltage of 0.9V is used and where the fabrication process and the temperature are changed.

FIG. 7 illustrates IDN-IUP from simulation of the PLL 1000 with the VCO 1400 of FIG. 5 according to an embodiment of the present invention. FIG. 7 also illustrates IDN-IUP from simulation of the conventional PLL without the delay time control unit 1420 of FIG. 5. Referring to FIG. 7, when the power supply voltage is changed, the variation of IDN-IUP for the PLL according to the present invention is smaller than the variation of IDN-IUP for the conventional PLL.

Figure 8:
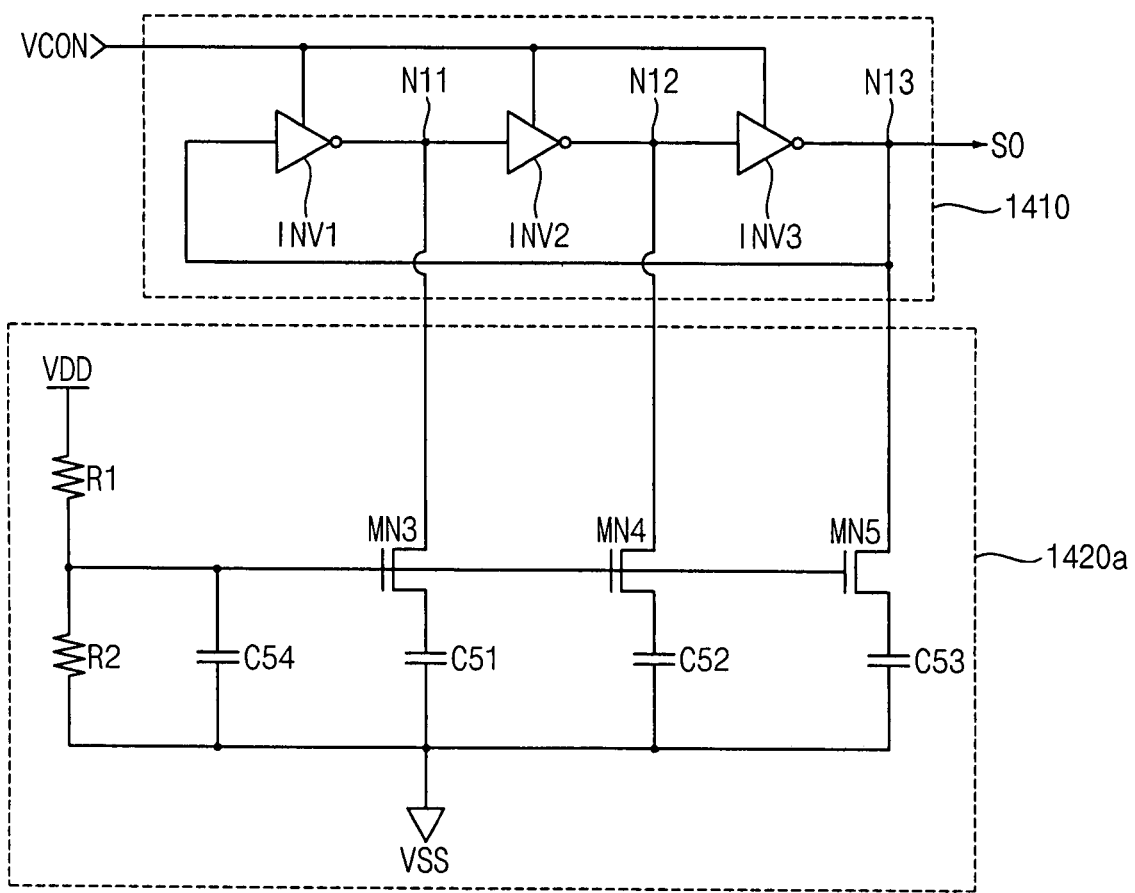
FIG. 8 is a circuit diagram of a VCO in the PLL of FIG. 1, according to another example embodiment of the present invention.

FIG. 8 is a circuit diagram of a VCO 1400a which may be used for the VCO 1400 in the PLL of FIG. 1. Elements having the same reference number in FIGS. 5 and 8 refer to elements having similar structure and/or function. However, the VCO 1400a of FIG. 8 is different from the VCO 1400 of FIG. 5 in that the drains of the NMOS transistors MN3, MN4, and MN5 are coupled to the nodes N11, N12, and N13, respectively, of the oscillation unit 1410. In addition, the capacitors C51, C52, and C53 are coupled between the sources of the NMOS transistors MN3, MN4, and MN5, respectively, and the reference node VSS.

Operation of the VCO 1400a of FIG. 8 is similar to the operation of the VCO 1400 of FIG. 5 as already described herein.

In either FIG. 5 or 8, the capacitor C54 is used as a frequency compensation capacitor. Such a capacitor C54 may be used for designing the desired frequency range of the oscillation signal SO.

Figure 9:
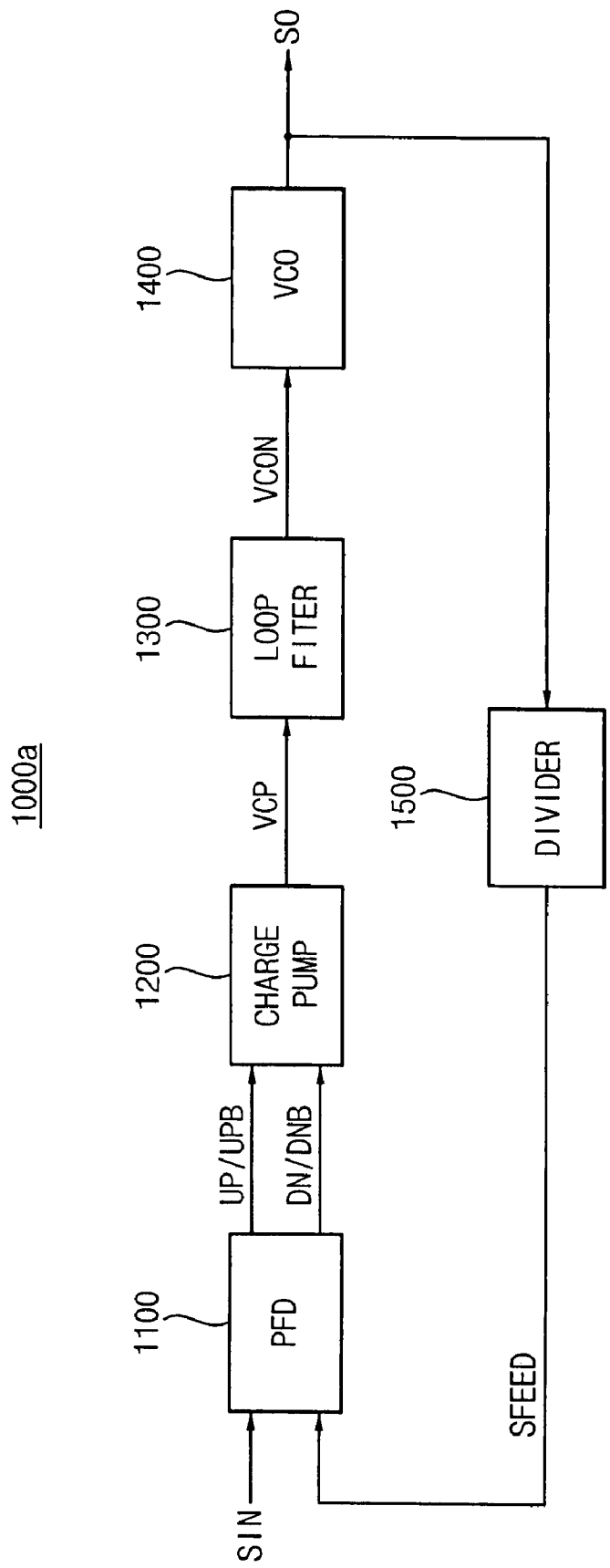
FIG. 9 is a block diagram of a PLL according to another example embodiment of the present invention.

FIG. 9 is a block diagram of a PLL 1000a according to another example embodiment of the present invention. Elements having the same reference number in FIGS. 1 and 9 refer to elements having similar structure and/or function.

However, the PLL 1000a of FIG. 9 is different from the PLL 1000 of FIG. 1 in that the PLL 1000a of FIG. 9 further includes a frequency divider 1500. The frequency divider 1500 performs frequency division on the oscillation signal SO to generate the feedback signal SFEED.

The PFD 1100 in the PLL 1000a of FIG. 9 generates the up signal UP, the up bar signal UPB, the down signal DN, and the down bar signal DNB based on a phase difference (and a frequency difference) between the input signal SIN and such a feedback signal SFEED that is the frequency divided oscillation signal SO. In contrast, the PFD 1100 in the PLL 1000 of FIG. 1 generates the up signal UP, the up bar signal UPB, the down signal DN, and the down bar signal DNB based on a phase difference (and a frequency difference) between the input signal SIN and the feedback signal SFEED that is just the oscillation signal SO.

Otherwise, the PLL 1000a of FIG. 9 operates similarly to the PLL 1000 of FIG. 1 as described herein. However, the PLL 1000a of FIG. 9 may generate the oscillation signal SO having a higher frequency than a frequency of the input signal SIN.

While the example embodiments of the present invention and their advantages have been described in detail, it should be understood that various changes, substitutions and alterations may be made herein without departing from the scope of the invention.

The present invention is limited only as defined in the following claims and equivalents thereof.

What is claimed is:

1. A voltage-controlled oscillator (VCO), comprising:
   an oscillation unit for generating an oscillation signal with a frequency determined by a VCO control signal; and
   a delay time control unit that adjusts a delay of the oscillation signal in response to a change of a power supply voltage, wherein the delay time control unit includes:
   a voltage divider coupled between a power supply generating the power supply voltage and a reference node;
   a plurality of capacitors;
   a plurality of field effect transistors, a respective one of the transistors and a respective one of the capacitors coupled in series between the oscillation unit and the reference node; and
   a frequency compensation capacitor coupled between gates of the transistors and the reference node.

2. The VCO of claim 1, wherein the delay time control unit adjusts the delay of the oscillation signal by adjusting at least one capacitance between the oscillation unit and the reference node in response to the change of the power supply voltage.

3. The VCO of claim 2, wherein the delay time control unit increases the delay of the oscillation signal in response to an increase in the power supply voltage and decreases the delay of the oscillation signal in response to a decrease in the power supply voltage.

4. The VCO of claim 2,
   wherein the voltage divider generates a switch control voltage;
   and wherein the switch control voltage is applied at the gates of the transistors.

5. The VCO of claim 4, wherein the oscillation unit includes:
   a plurality of inverters coupled as a ring oscillator, wherein the inverters are pulled-up by the VCO control signal, and wherein a respective one of the transistors and a respective one of the capacitors are coupled in series between an output of a respective one of the inverters and the reference node.

6. The VCO of claim 1, wherein the VCO is coupled in a feed-back loop of a phase-locked loop, and wherein the VCO control signal is adjusted with the adjusted delay of the oscillation signal.

7. The VCO of claim 6, wherein the VCO control signal increases in response to an increase in the power supply voltage, and wherein the VCO control signal decreases in response to a decrease in the power supply voltage.

8. A phase-locked loop (PLL) comprising:
a phase-frequency detector for generating up and down signals from a phase difference between an input signal and an oscillation signal;
a charge pump for generating charging and discharging currents in response to the up and down signals;
a loop filter for generating a VCO control signal by integrating the charging and discharging currents; and
a VCO including:
an oscillation unit for generating the oscillation signal with a frequency determined by the VCO control signal; and
a delay time control unit that adjusts a delay of the oscillation signal in response to a change of a power supply voltage, wherein the delay time control unit includes:
a voltage divider coupled between a power supply generating the power supply voltage and a reference node;
a plurality of capacitors;
a plurality of field effect transistors, a respective one of the transistors and a respective one of the capacitors coupled in series between the oscillation unit and the reference node; and
a frequency compensation capacitor coupled between gates of the transistors and the reference node.

9. The PLL of claim 8, wherein the charge pump includes:
a first current source having a first terminal coupled to the power supply generating the power supply voltage;
a first PMOS transistor having a source coupled to a second terminal of the first current source, a gate having the up signal applied thereon, and a drain coupled to a first node;
a second PMOS transistor having a source coupled to the second terminal of the first current source, a gate having an inverse of the up signal applied thereon, and a drain coupled to a second node;
an operational amplifier configured as a voltage-follower between the first and second nodes;
a second current source having a first terminal coupled to a reference node;
a first NMOS transistor having a drain coupled to the first node, a gate having an inverse of the down signal applied thereon, and a source coupled to a second terminal of the second current source; and
a second NMOS transistor having a drain coupled to the second node, a gate having the down signal applied thereon, and a source coupled to the second terminal of the second current source.

10. The PLL of claim 9, wherein the charging and discharging currents have substantially same magnitudes when a following condition is satisfied, $$VCON=(VDD+|Vtp|-Vtn)/2,$$

with VCON being the VCO control voltage, VDD being the power supply voltage, Vtn being a threshold voltage of the second NMOS transistor, and Vtp being a threshold voltage of the second PMOS transistor,
and wherein the VCO control signal increases in response to an increase in the power supply voltage, and wherein the VCO control signal decreases in response to a decrease in the power supply voltage.

11. The PLL of claim 8, further comprising:
a frequency divider coupled between the VCO and the phase-frequency detector for performing frequency division on the oscillation signal,
wherein the phase-frequency detector generates the up and down signals from a phase difference between the input signal and the frequency-divided oscillation signal.

12. The PLL of claim 8, wherein the delay time control unit adjusts the delay of the oscillation signal by adjusting at least one capacitance between the oscillation unit and a reference node in response to a change of the power supply voltage.

13. The PLL of claim 12, wherein the delay time control unit increases the delay of the oscillation signal in response to an increase in the power supply voltage and decreases the delay of the oscillation signal in response to a decrease in the power supply voltage.

14. The PLL of claim 12,
wherein the voltage divider generates a switch control voltage;
and wherein the switch control voltage is applied at the gates of the transistors.

15. The PLL of claim 14, wherein the oscillation unit includes:
a plurality of inverters coupled as a ring oscillator, wherein the inverters are pulled-up by the VCO control signal,
and wherein a respective one of the transistors and a respective one of the capacitors are coupled in series between an output of a respective one of the inverters and the reference node.

16. A method of operating a phase-locked loop (PLL) comprising:
generating up and down signals from a phase difference between an input signal and an oscillation signal;
generating charging and discharging currents in response to the up and down signals;
generating a VCO control signal by integrating the charging and discharging currents;
generating the oscillation signal with a frequency determined by the VCO control signal;
adjusting a delay of the oscillation signal in response to a change of a power supply voltage;
generating the charging and discharging currents having substantially same magnitudes with a following condition being satisfied, $$VCON=(VDD+|Vtp|-Vtn)/2,$$

with VCON being the VCO control signal, VDD being the power supply voltage, Vtn being a threshold voltage of an NMOS transistor, and Vtp being a threshold voltage of a PMOS transistor
increasing the VCO control signal in response to an increase in the power supply voltage; and
decreasing the VCO control signal in response to a decrease in the power supply voltage.

17. The method of claim 16, further comprising:
adjusting the delay of the oscillation signal by adjusting at least one capacitance between an oscillation unit and a reference node in response to the change of the power supply voltage.

18. The method of claim 17, further comprising:
generating a switch control voltage by voltage division between the power supply voltage and the reference node; and
applying the switch control voltage at gates of a plurality of field effect transistors, with a respective one of the transistors and a respective one of a plurality of capacitors being coupled in series between the oscillation unit and the reference node.

19. The method of claim 18, wherein the oscillation signal is generated from a plurality of inverters coupled as a ring oscillator, with the inverters being pulled-up by the VCO control signal, and wherein a respective one of the transistors and a respective one of the capacitors are coupled in series between an output of a respective one of the inverters and the reference node.

* * * * *